(12) United States Patent
Chen et al.

(10) Patent No.: US 11,114,597 B2
(45) Date of Patent: *Sep. 7, 2021

(54) DISPLAY DEVICE HAVING AN ELECTRONIC DEVICE DISPOSED ON A FIRST PAD AND A SECOND PAD

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/554,675

(22) Filed: Aug. 29, 2019

(65) Prior Publication Data

US 2019/0386193 A1 Dec. 19, 2019

Related U.S. Application Data

(63) Continuation of application No. 15/928,238, filed on Mar. 22, 2018, now Pat. No. 10,446,729.

(51) Int. Cl.
*H01L 33/62* (2010.01)
*H01L 25/075* (2006.01)
(Continued)

(52) U.S. Cl.
CPC ............ *H01L 33/62* (2013.01); *B23K 35/262* (2013.01); *B23K 35/30* (2013.01); *B23K 35/32* (2013.01);
(Continued)

(58) Field of Classification Search
CPC .............. H01L 25/167; H01L 27/124; H01L 33/38–387; H01L 2224/13017;
(Continued)

(56) References Cited

U.S. PATENT DOCUMENTS 6,025,730 A * 2/2000 Akram ................. G01R 1/0408
324/750.25
6,172,422 B1 1/2001 Chigawa et al.
(Continued)

FOREIGN PATENT DOCUMENTS

JP 2011-14644 * 1/2011 ............... H05K 3/34

OTHER PUBLICATIONS

European Search Report dated Aug. 9, 2019 for the Corresponding Application No. 19162851.0 in Europe, pp. 1-7.
(Continued)

*Primary Examiner* — Khiem D Nguyen
(74) *Attorney, Agent, or Firm* — McClure, Qualey & Rodack, LLP

(57) ABSTRACT

A display device is provided. The display device includes a substrate and a first metal line and a second metal line disposed on the substrate. The display device includes a first pad and a second pad disposed on the substrate and electrically connected to the first metal line and the second metal line respectively. The display device further includes an electronic device disposed on the first pad and the second pad. The electronic device includes a first connecting post and a second connecting post, wherein a distance between the first connecting post and the second connecting post is in a range from 1 um to 200 um. A portion of the first connecting post is embedded in the first pad and a portion of the second connecting post is embedded in the second pad.

18 Claims, 13 Drawing Sheets

(51) Int. Cl.
*H01L 25/16* (2006.01)
*H01L 27/12* (2006.01)
*H01L 23/00* (2006.01)
*H05K 1/18* (2006.01)
*B23K 35/32* (2006.01)
*H05K 1/02* (2006.01)
*B23K 35/30* (2006.01)
*B23K 35/26* (2006.01)
*H01L 33/00* (2010.01)
*H01L 33/06* (2010.01)
*H01L 33/32* (2010.01)
*H01L 33/40* (2010.01)
*H01L 33/44* (2010.01)

(52) U.S. Cl.
CPC .............. *H01L 24/19* (2013.01); *H01L 24/20* (2013.01); *H01L 24/81* (2013.01); *H01L 25/0753* (2013.01); *H01L 25/167* (2013.01); *H01L 27/124* (2013.01); *H01L 33/0093* (2020.05); *H05K 1/0296* (2013.01); *H05K 1/181* (2013.01); *B23K 35/26* (2013.01); *H01L 33/0075* (2013.01); *H01L 33/06* (2013.01); *H01L 33/32* (2013.01); *H01L 33/40* (2013.01); *H01L 33/44* (2013.01); *H01L 2224/18* (2013.01); *H01L 2224/32225* (2013.01); *H01L 2933/0016* (2013.01); *H01L 2933/0025* (2013.01); *H01L 2933/0066* (2013.01)

(58) Field of Classification Search
CPC ....... H01L 2224/13024; H01L 2224/18; H01L 24/83; H01L 33/62; H01L 24/05; H01L 24/06; H01L 24/11; H01L 24/13; H01L 24/14; H01L 24/17; H01L 24/19; H01L 24/20; H01L 24/73; H01L 24/81; H01L 24/95; H01L 33/44; H01L 33/0075; H01L 25/0753; B23K 35/26; B23K 35/30; B23K 35/32; B23K 35/262; G09G 3/32; G09G 3/2003; G09G 2300/0426; G09G 2300/0439
See application file for complete search history.

(56) References Cited

U.S. PATENT DOCUMENTS

| | | | | |
|---|---|---|---|---|
| 6,969,624 B2* | 11/2005 | Iwafuchi | ............. | H01L 33/0093 438/22 |
| 7,009,220 B2* | 3/2006 | Oohata | ................... | H01L 33/54 257/103 |
| 7,202,677 B2* | 4/2007 | Pedersen | .............. | B23K 1/0016 257/E21.503 |
| 9,018,731 B2* | 4/2015 | Cheng | ..................... | H01L 28/10 257/531 |
| 9,165,238 B2* | 10/2015 | Cleeves | ................. | H01L 23/66 |
| 10,446,729 B1* | 10/2019 | Chen | ..................... | H01L 25/167 |
| 10,535,640 B2* | 1/2020 | Lee | ........................ | H01L 24/24 |
| 2009/0014205 A1* | 1/2009 | Kobayashi | ........... | H05K 3/4691 174/255 |
| 2010/0078670 A1* | 4/2010 | Kim | ........................ | H01L 33/46 257/98 |
| 2011/0108800 A1* | 5/2011 | Pan | ................... | H01L 21/02381 257/14 |
| 2014/0235052 A1* | 8/2014 | Park | ................... | H01L 21/76873 438/653 |
| 2015/0327388 A1* | 11/2015 | Menard | .................... | H01L 24/29 361/783 |
| 2016/0155724 A1* | 6/2016 | Kim | ........................ | H01L 24/94 257/48 |
| 2017/0048976 A1 | 2/2017 | Prevatte et al. | | |
| 2017/0186740 A1* | 6/2017 | Cok | ........................ | H01L 22/14 |
| 2017/0229482 A1* | 8/2017 | Chen | ........................ | H01L 27/124 |
| 2017/0250167 A1 | 8/2017 | Bower et al. | | |
| 2017/0256521 A1* | 9/2017 | Cok | ................... | H01L 23/49838 |
| 2017/0270852 A1* | 9/2017 | Meitl | ....................... | G09G 3/32 |
| 2017/0290158 A1 | 10/2017 | Pihlman et al. | | |
| 2017/0338216 A1* | 11/2017 | De Winter | ............ | H01L 21/306 |
| 2017/0352647 A1* | 12/2017 | Raymond | ................ | G09G 3/32 |
| 2018/0033853 A1* | 2/2018 | Bower | .................. | H01L 27/156 |
| 2018/0211945 A1 | 7/2018 | Cok et al. | | |

OTHER PUBLICATIONS

Chinese language office action dated Mar. 9, 2021, issued in application No. CN 201910146574.2.

* cited by examiner

DISPLAY DEVICE HAVING AN ELECTRONIC DEVICE DISPOSED ON A FIRST PAD AND A SECOND PAD

CROSS REFERENCE TO RELATED APPLICATIONS

This application is a Continuation of U.S. patent application Ser. No. 15/928,238, filed Mar. 22, 201 and entitled "DISPLAY DEVICE HAVING AN ELECTRONIC DEVICE DISPOSED ON A FIRST PAD AND A SECOND PAD" now U.S. Pat. No. 10,446,729, the entirety of which is incorporated by reference herein.

BACKGROUND

Technical Field

The present disclosure relates to a display device, and in particular it relates to the interconnection of the electronic components in the display device.

Description of the Related Art

Electronic products that come with a display panel, such as smartphones, tablets, notebooks, monitors, and TVs, have become indispensable necessities in modern society. With the flourishing development of such portable electronic products, consumers have high expectations regarding the quality, the functionality, and the price of such products. The development of next-generation display devices has been focused on techniques that are energy-saving and environmentally friendly.

Micro LED technology is an emerging flat panel display technology. Micro LED displays drive an array of addressed micro LEDs. Micro LED displays may produce seamless images with a wide viewing angle, high brightness, and high contrast. However, due to the small size of a micro LED (e.g., in a range from about 1 um to about 200 um), integration and packaging issues are one of the main obstacles for commercialization of such products.

Using current manufacturing methods, micro LEDs are generally formed and divided into several micro LED dies (e.g., micro-lighting dies) on a wafer substrate and then transferred to another destination substrate. For example, the driving circuits and related circuits are formed on the destination substrate to provide an array substrate (e.g., a TFT array substrate), and the micro LED dies are then mounted on the array substrate. Due to the small size of micro LED dies, transferring the micro LED dies to the destination substrate is a burdensome task. In addition, the electrical connections between the micro LED (including the integrated electronic component where these dies are formed) and the destination substrate is also a problem that needs to be taken care of.

Accordingly, it is desirable to develop a structure and method that can effectively maintain or improve the efficiency of the transfer, or improve the electrical interconnection of a small electronic component such as a micro LED to a destination substrate.

SUMMARY

In accordance with some embodiments of the present disclosure, a display device is provided. The display device includes a substrate and a first metal line and a second metal line disposed on the substrate. The display device also includes a first pad and a second pad disposed on the substrate and electrically connected to the first metal line and the second metal line respectively. The display device further includes an electronic device disposed on the first pad and the second pad. The electronic device includes a first connecting post and a second connecting post, wherein a distance between the first connecting post and the second connecting post is in a range from 1 um to 200 um. A portion of the first connecting post is embedded in the first pad and a portion of the second connecting post is embedded in the second pad.

In accordance with some embodiments of the present disclosure, a display device is provided. The display device includes an integrated electronic component, a second substrate disposed below the integrated electronic component, and a third pad and a fourth pad disposed on the second substrate and electrically connected to the first metal line and the second metal line respectively. The integrated electronic component includes a first substrate and a first metal line and a second metal line disposed on the first substrate. The integrated electronic component also includes a first pad and a second pad disposed on the first substrate and electrically connected to the first metal line and the second metal line respectively. The integrated electronic component further includes an electronic device disposed on the first pad and the second pad, and the electronic device includes a first connecting post and a second connecting post. A portion of the first connecting post is embedded in the first pad and a portion of the second connecting post is embedded in the second pad. The first metal line includes a third connecting post and the second metal line includes a fourth connecting post. The third connecting post and the fourth connecting post are in contact with the third pad and the fourth pad respectively.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
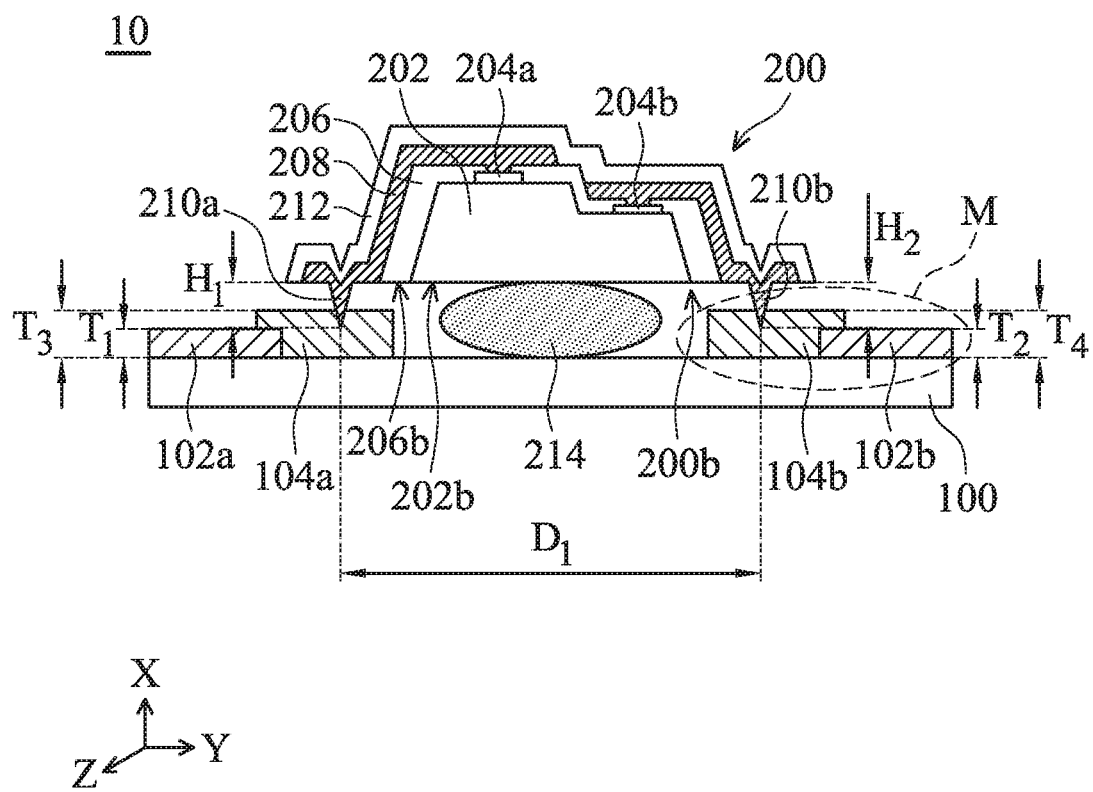
FIG. 1 illustrates the cross-sectional views of the display device in accordance with some embodiments of the present disclosure.

The display device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those with ordinary skill in the art. In addition, the expressions "a layer overlying another layer", "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

The terms "about" and "substantially" typically mean+/− 20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The present disclosure provides a structure for improving the efficiency of the electrical connection between relatively small electronic devices such as micro LEDs, organic LEDs, quantum-dot LEDs or integrated electronic components and a relatively large destination substrate such as an array substrate. The display device provided in the present disclosure includes the connecting posts that can be securely embedded in the conductive elements of the destination substrate, such as the pads for the interconnection. The electronic devices can therefore maintain effective electrical connection to the circuit system on the destination substrate. In addition, the configuration of the intermediate substrate in the display device may reduce the times that are required for the transfer of the small electronic devices to the destination substrate in accordance with some embodiments of the present disclosure.

FIG. 1 illustrates a cross-sectional view of the display device 10 in accordance with some embodiments of the present disclosure. It should be understood that additional features may be added to the display device in accordance with some embodiments of the present disclosure. Some of the features described below may be replaced or eliminated in accordance with some embodiments of the present disclosure.

Referring to FIG. 1, the display device 10 includes a first substrate 100 and an electronic device 200 disposed on the first substrate 100. The first substrate 100 may be an intermediate substrate or a destination substrate (such as an array substrate) of the display device 10. In some embodiments, the material of the first substrate 100 may include, but is not limited to, glass, quartz, sapphire, polycarbonate (PC), polyimide (PI), polyethylene terephthalate (PET), rubbers, glass fibers, other polymer materials, any other suitable substrate material, or a combination thereof. In some embodiments, the first substrate 100 may be formed of a metal-glass fiber composite plate, a metal-ceramic composite plate, a printed circuit board, or any other suitable material, but it is not limited thereto.

The display substrate 10 also includes a first metal line 102a and a second metal line 102b disposed on the first substrate 100. The first metal line 102a and the second metal line 102b may be any conductive element on the first substrate 100. For example, the first metal line 102a and the second metal line 102b each may be the conductive elements of the circuit on the array substrate. In some embodiments, the first metal line 102a and the second metal line 102b may be the data line or scan line on the array substrate. The first metal line 102a and the second metal line 102b may respectively have a thickness $T_1$ and a thickness $T_2$ in the X direction of the first substrate 100, for example, in the X direction as shown in FIG. 1, and X direction is the normal direction of the first substrate 100. In some embodiments, the thickness $T_1$ of the first metal line 102a may be in a range from about 0.1 µm to about 1 µm, or from about 0.2 um to about 0.6 um. In some embodiments, the thickness $T_2$ of the second metal line 102b may be in a range from about 0.1 µm to about 1 µm, or from about 0.2 um to about 0.6 um. The thickness $T_1$ of the first metal line 102a may be the same as or different than the thickness $T_2$ of the second metal line 102b.

In some embodiments, the first metal line 102a and the second metal line 102b each may be formed of conductive materials. The conductive material for forming the first metal line 102a and the second metal line 102b may include, but is not limited to, copper, aluminum, tungsten, titanium, gold, silver, molybdenum, copper alloys, aluminum alloys, tungsten alloys, titanium alloys, gold alloys, silver alloys, molybdenum alloys, any other suitable conductive materials, or a combination thereof. In some embodiments, the first metal line 102a and the second metal line 102b each may be formed of a conductive material having a relatively high melting temperature. In some embodiments, the first metal line 102a and the second metal line 102b each may be formed of a conductive material having a melting temperature in a range from about 660° C. to about 3410° C.

Figure 2A:
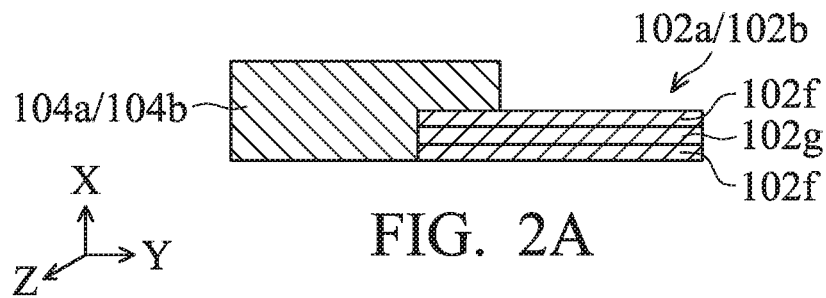
FIGS. 2A-2D illustrate the cross-sectional views of the metal lines and the pads in the region M in FIG. 1 in accordance with some embodiments.

In addition, in some embodiments, the first metal line 102a and/or the second metal line 102b may include multilayer structures. For example, FIG. 2A illustrates a cross-sectional view of the metal lines (the first metal line 102a and the second metal line 102b) and the pads (the first pad 104a and the second pad 104b) in the region M in FIG. 1 in accordance with some embodiments. As shown in FIG. 2A, the metal line 102a/102b may be a two-layer structure in accordance with some embodiments. In particular, the metal line 102a/102b may be a coaxial two-layer structure, which includes an inner layer 102g and an outer layer 102f. In certain embodiments, the inner layer 102g is made of aluminum and the outer layer 102f is made of molybdenum.

Next, referring back to FIG. 1, the display substrate 10 also includes a first pad 104a and a second pad 104b disposed on the first substrate 100. The first pad 104a and the second pad 104b are electrically connected to the first metal line 102a and the second metal line 102b respectively. In other words, the first pad 104a provides the electrical connection between the electronic device 200 and the first metal line 102a on the first substrate 100. The second pad 104b provides the electrical connection between the electronic device 200 and the second metal line 102b on the first substrate 100. As shown in FIG. 1, the first pad 104a and the second pad 104b at least partially overlaps the first metal line 102a and the second metal line 102b respectively, so that the electrical connection between the pads 104a/104b and the metal lines 102a/102b may be well maintained. In particular, the overlap between the pads 104a/104b and the metal lines 102a/102b may assist in the transmission of the electrical signals in the metal lines 102a/102b or reduce the possibility of leakage of electricity.

Figure 2B:
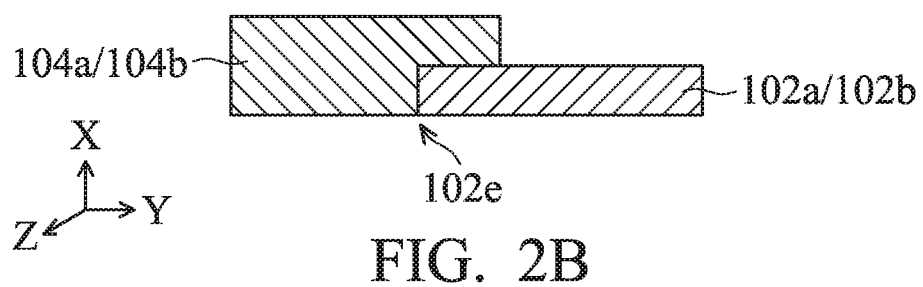
Figure 2C:
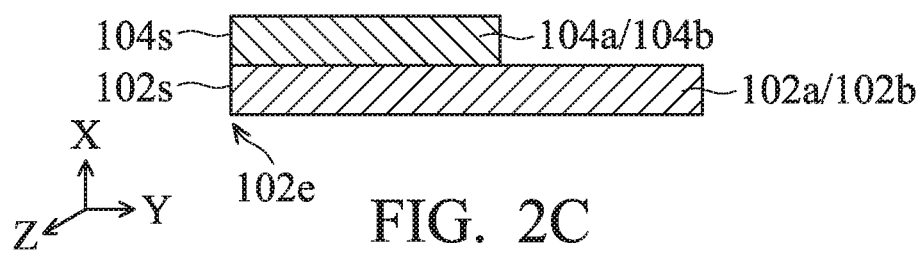
Figure 2D:
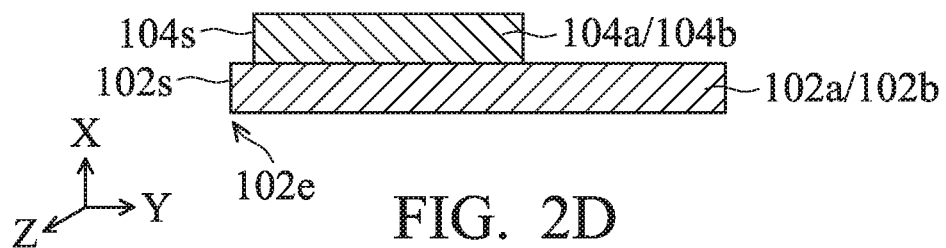

The configurations of the metal lines 102a/102b and the pads 104a/104b in accordance with some embodiments of the present disclosure are described in detail in FIGS. 2B-2D. FIGS. 2B-2D illustrate the cross-sectional views of the metal lines (the first metal line 102a and the second metal line 102b) and the pads (the first pad 104a and the second pad 104b) in the region M in FIG. 1 in accordance with some embodiments. It should be understood that the elements other than the metal line and the pad are omitted for clarity.

As shown in FIG. 2B, a portion of the pad (the first pad 104a or the second pad 104b) overlaps the metal line (the first metal line 102a or the second metal line 102b) in accordance with some embodiments. Specifically, the pad may cover the sidewall and a portion of the top surface of the metal line. As shown in FIG. 2C and FIG. 2D, the entire pad is disposed on the metal line in accordance with some embodiments. The sidewall 104s of the pad may be aligned with the sidewall 102s of the metal line in accordance with some embodiments (as shown in FIG. 2C). The metal line may further extend toward the center of the electronic device 200 and the sidewall 102s of the metal line may protrude from the sidewall 104s of the pad in accordance with some embodiments (as shown in FIG. 2D).

Figure 2E:
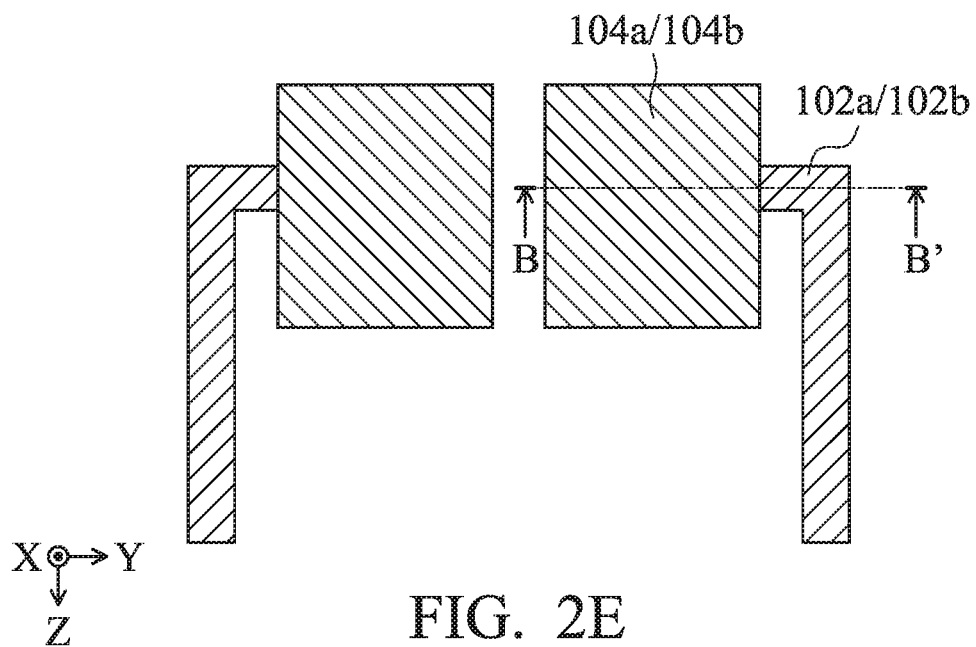
FIG. 2E and FIG. 2F illustrate the top views of the metal lines and the pads in the region M in FIG. 1 in accordance with some embodiments.
Figure 2F:
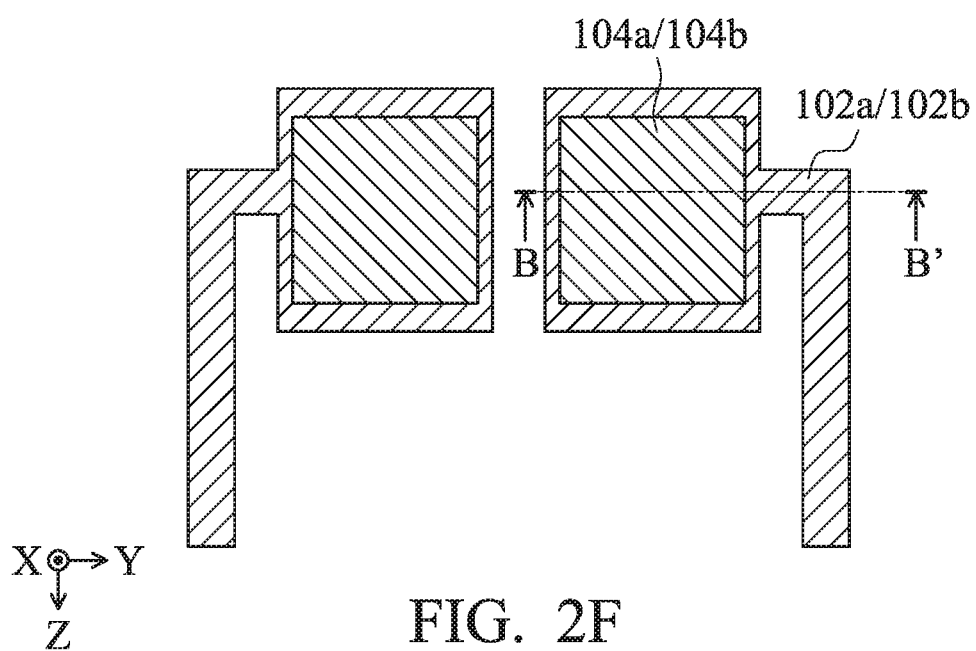

On the other hand, FIG. 2E and FIG. 2F illustrate the top views of the metal lines (the first metal line 102a and the second metal line 102b) and the pads (the first pad 104a and the second pad 104b) in the region M in FIG. 1 in accordance with some embodiments. In addition, the cross-sectional view along the line B-B' in FIG. 2E may correspond to the cross-sectional views as shown in FIG. 2B and FIG. 2C. The cross-sectional view along the line B-B' in FIG. 2F may correspond to the cross-sectional view as shown in FIG. 2D. Referring to FIGS. 2B, 2C and 2E, the pad may entirely overlap one end 102e of the metal line in accordance with some embodiments. Referring to FIG. 2D and FIG. 2F, the pad may partially overlap one end 102e of the metal line in accordance with some other embodiments.

Next, referring back to FIG. 1, the first pad 104a and the second pad 104b may respectively have a thickness $T_3$ and a thickness $T_4$ in the X direction of the first substrate 100. In some embodiments, the thickness $T_3$ of the first pad 104a may be in a range from about 0.2 µm to about 50 µm, or from about 5 um to about 15 um. In some embodiments, the thickness $T_4$ of the second pad 104b may be in a range from about 0.2 µm to about 50 µm, or from about 5 um to about 15 um. The thickness $T_3$ of the first pad 104a may be the same as or different than the thickness $T_4$ of the second pad 104b. In some embodiments, the thickness $T_3$ of the first pad 104a is greater than the thickness $T_1$ of the first metal line 102a. In some embodiments, the thickness $T_4$ of the second pad 104b is greater than the thickness $T_2$ of the second metal line 102b.

In some embodiments, the first pad 104a and the second pad 104b each may be formed of conductive materials. The conductive material for forming the first pad 104a and the second pad 104b may include, but is not limited to, solder materials, tin, indium, gallium, tin alloys, indium alloys, gallium alloys, gallium-indium alloys or a combination thereof. In some embodiments, the first pad 104a and the second pad 104b each may be formed of conductive materials having a relatively low melting temperature. In particular, the first pad 104a and the second pad 104b each may be formed of a conductive material having a relatively low melting temperature compared to the melting temperature of the first metal line 102a and the second metal line 102b. In some embodiments, the first pad 104a and the second pad 104b each may be formed of conductive materials having a temperature in a range from about 100° C. to about 400° C.

In some embodiments, the first metal line 102a, the second metal line 102b, the first pad 104a and the second pad 104b may be formed by using chemical vapor deposition, physical vapor deposition, electroplating process, electroless plating process, any other suitable processes, or a combination thereof. The chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), or atomic layer deposition (ALD). The physical vapor deposition may include, but is not limited to, sputtering, evaporation, or pulsed laser deposition (PLD).

Still referring to FIG. 1, the electronic device 200 includes a semiconductor die 202, a first electrode 204a, a second electrode 204b, a first dielectric layer 206, a conductive layer 208, a first connecting post 210a, a second connecting post 210b, and a second dielectric layer 212. The electronic device 200 may include an integrated circuit. For example, the electronic device 200 may include, but is not limited to, a digital circuit, an LED, a photodiode, a transistor, or any other suitable electronic devices. The electronic device 200 may be a micro LED in accordance with some embodiments. It should be understood that although one electronic device 200 is illustrated in FIG. 1, there may be more than one electronic device 200 disposed on the first substrate 100.

As shown in FIG. 1, the electronic device 200 is disposed on the first pad 104a and the second pad 104b. The semiconductor die 202 of the electronic device 200 may include multiple layers of different materials. In some embodiments, the semiconductor die 202 may include, but is not limited to, semiconductor layers, or quantum well layers. In some embodiments, the semiconductor layers may be formed of the III-V compounds. The III-V compounds may include, but is not limited to, gallium nitride (GaN), indium nitride (InN), aluminum nitride (AlN), indium gallium nitride (InGaN), aluminum gallium nitride (AlGaN), aluminum indium gallium nitride (AlGaInN) or a combination thereof. In some embodiments, the material of the quantum well layer may include, but is not limited to, indium gallium nitride, a gallium nitride or a combination thereof.

The semiconductor die 202 may be an organic micro LED die in accordance with some embodiments. The semiconductor die 202 may be an inorganic micro LED die in accordance with some embodiments. In some embodiments, the cross-sectional area of the semiconductor die 202 may have a length ranging from about 1 μm to about 175 μm in Y direction and may have a width ranging from about 1 μm to about 175 μm in Z direction. In some embodiments, the semiconductor die 202 may have a size ranging from about 1 μm×1 μm to about 175 μm×175 μm×175 μm. In some embodiments, the semiconductor die 202 may be formed by using an epitaxial growth process. For example, metal organic chemical vapor deposition (MOCVD), molecular beam epitaxy (MBE), hydride vapor phase epitaxy (HYPE), liquid phase epitaxy (LPE), or another suitable process may be used to form the semiconductor die 202.

The first electrode 204a and the second electrode 204b may be disposed over the semiconductor die 202. In some embodiments where the electronic device 200 is a micro LED, the first electrode 204a and the second electrode 204b may serve as the n-electrode and p-electrode of the micro LED respectively. In some embodiments, the first electrode 204a and the second electrode 204b may be formed of metallic conductive materials. The metallic conductive material may include, but is not limited to, copper, aluminum, tungsten, titanium, gold, silver, molybdenum, platinum, nickel, copper alloys, aluminum alloys, tungsten alloys, titanium alloys, gold alloys, silver alloys, molybdenum alloys, platinum alloys, nickel alloys, any other suitable conductive materials, or a combination thereof. In some embodiments, the first electrode 204a and the second electrode 204b may be formed of transparent conductive materials, for example, the transparent conductive material (TCO) may include, but is not limited to, indium tin oxide (ITO), tin oxide (SnO), zinc oxide (ZnO), indium zinc oxide (IZO), indium gallium zinc oxide (IGZO), indium tin oxide (ITZO), antimony tin oxide (ATO), antimony zinc oxide (AZO), or a combination thereof. It should be noted that, the first electrode 204a and the second electrode 204b may be formed of a material having a relatively high melting temperature compared with the conductive layer 208 of electronic device 200. In some embodiments, the first electrode 204a and the second electrode 204b may be formed by using chemical vapor deposition, physical vapor deposition, electroplating process, electroless plating process, any other suitable processes, or a combination thereof.

Still referring to FIG. 1, the first dielectric layer 206 is disposed over the semiconductor die 202. In some embodiments, the first dielectric layer 206 may cover a portion of the first electrode 204a and a portion of the second electrode 204b. In other words, the first dielectric layer 206 may partially expose the first electrode 204a and the second electrode 204b so that the first electrode 204a and the second electrode 204b may be electrically connected to the conductive layer 208. In some embodiments, the first dielectric layer 206 may include, but is not limited to, silicon oxide, silicon nitride, silicon oxynitride, high-k dielectric material, any other suitable dielectric material, or a combination thereof. The high-k dielectric material may include, but is not limited to, metal oxide, metal nitride, metal silicide, transition metal oxide, transition metal nitride, transition metal silicide, metal oxynitride, metal aluminate, zirconium silicate, zirconium aluminate. In some embodiments, the first dielectric layer 206 may be formed by using chemical vapor deposition, spin coating, any other suitable processes, or a combination thereof.

In addition, the electronic device 200 includes the conductive layer 208 disposed over the first dielectric layer 206. As described above, the conductive layer 208 is in contact with portions of the first electrode 204a and the second electrode 204b. The conductive layer 208 is electrically connected to the first electrode 204a and the second electrode 204b separately. In addition, as shown in FIG. 1, the conductive layer 208 includes a first connecting post 210a and a second connecting post 210b. The first connecting post 210a and the second connecting post 210b are each defined as the portion that is substantially below the bottom side 200b of the electronic device 200. The first connecting post 210a and the second connecting post 210b may protrude from the bottom surface 206b of the first dielectric layer 206 in accordance with some embodiments. The first connecting post 210a and the second connecting post 210b may also protrude from the bottom surface 202b of the semiconductor die 202 in accordance with some embodiments. In other words, the first connecting post 210a and the second connecting post 210b extend toward the first substrate 100. The first connecting post 210a and the second connecting post 210b extend toward the first pad 104a and the second pad 104b respectively. In addition, at least a portion of the first connecting post 210a is embedded in the first pad 104a and at least a portion of the second connecting post 210b is embedded in the second pad 104b. Thus, the first connecting post 210a is electrically connected to the first pad 104a and the second connecting post 210b is electrically connected to the second pad 104b. It should be understood that although two connecting posts are disposed in the embodiment shown in FIG. 1, the amount of the connecting post may be adjusted according to the needs in some other embodiments.

As shown in FIG. 1, the first connecting post 210a and the second connecting post 210b are separated apart from each other by a distance $D_1$. In some embodiments, the distance $D_1$ between the first connecting post 210a and the second connecting post 210b is in a range from about 1 um to about 200 um, or from about 2 um to about 50 um. In some embodiments, the distance $D_1$ between the first connecting post 210a and the second connecting post 210b is defined as the distance between any position within the first connecting post 210a and any position within the second connecting post 210b. In some other embodiments, the distance $D_1$ between the first connecting post 210a and the second connecting post 210b is defined as the distance between the lowest point in the X direction of the first connecting post 210a and the lowest point in the X direction of the second connecting post 210b in a cross section.

Moreover, the first connecting post 210a and the second connecting post 210b may respectively have a height $H_1$ and a height $H_2$ in the X direction of the first substrate 100. In some embodiments, the height $H_1$ of the first connecting post 210a may be in a range from about 0.05 μm to about 10 μm, or from about 1 um to about 5 um. In some embodiments, the height $H_2$ of the second connecting post 210b may be in a range from about 0.05 μm to about 10 μm, or from about 1 um to about 5 um.

In some embodiments, the first connecting post 210a, the second connecting post 210b and the conductive layer 208 are integrally formed. The first connecting post 210a, the second connecting post 210b and the conductive layer 208 may be a continuous structure. In some other embodiments, the first connecting post 210a, the second connecting post 210b and the conductive layer 208 are separately formed. The first connecting post 210a, the second connecting post 210b and the conductive layer 208 may be independent elements. In addition, the first connecting post 210a and the conductive layer 208 may be formed of the same or different materials. Similarly, the second connecting post 210b and the conductive layer 208 may be formed of the same or different materials.

In some embodiments, the first connecting post 210a and the second connecting post 210b each may be formed of conductive materials. The conductive material for forming the first connecting post 210a and the second connecting post 210b may include, but is not limited to, copper, aluminum, tungsten, titanium, gold, silver, molybdenum, copper alloys, aluminum alloys, tungsten alloys, titanium alloys, gold alloys, silver alloys, molybdenum alloys, any other suitable conductive materials, or a combination thereof. In some embodiments, the first connecting post 210a and the second connecting post 210b each may be formed of a conductive material having a relatively high melting temperature. In some embodiments, the first connecting post 210a and the second connecting post 210b each may be formed of a conductive material having a melting temperature in a range from about 660° C. to about 3410° C.

The second dielectric layer 212 is formed over the conductive layer 208. The second dielectric layer 212 also covers the first connecting post 210a and the second connecting post 210b. In some embodiments, the second dielectric layer 212 may include, but is not limited to, silicon oxide, silicon nitride, silicon oxynitride, high-k dielectric material, any other suitable dielectric material, or a combination thereof. The high-k dielectric material may include, but is not limited to, metal oxide, metal nitride, metal silicide, transition metal oxide, transition metal nitride, transition metal silicide, metal oxynitride, metal aluminate, zirconium silicate, zirconium aluminate. In some embodiments, the second dielectric layer 212 may be formed by using chemical vapor deposition, spin coating, any other suitable processes, or a combination thereof.

In addition, the display device 10 also includes an adhesive layer 214 disposed between the electronic device 200 and the first substrate 100. The adhesive layer 214 adhere the electronic device 200 and the first substrate 100 together and the first connecting post 210a and the second connecting post 210b are held in physical contact with the first pad 104a and the second pad 104b on the first substrate 100 respectively. The adhesive layer 214 may be formed of adhesive materials. In some embodiments, the adhesive layer 214 may be an insulator. In some embodiments, the material of the adhesive layer 214 may include, but is not limited to, heat-curing adhesives, light-curing adhesives, or a combination thereof. The light-curing adhesives may include UV light-curing adhesives or visible light-curing adhesives.

In some embodiments, the adhesive layer 214 may be formed by using coating, spray coating, inkjet printing, any other suitable methods, or a combination thereof, but is not limited thereto. As shown in FIG. 1, the adhesive layer 214 may be formed in the shape of a drop in accordance with some embodiments.

It should be noted that, before the electronic device 200 is affixed to the first substrate 100, the first substrate 100 and the elements formed thereon are heated in accordance with some embodiments. Specifically, the first pad 104a and the second pad 104b are heated to be in a melted state so that the first connecting post 210a and the second connecting post 210b can be embedded into the first pad 104a and the second pad 104b respectively. In some embodiments, the melting temperature of the connecting posts (the first connecting post 210a and the second connecting post 210b) is higher than the melting temperature of the pads (the first pad 104a and the second pad 104b). In such cases, the temperature of the heating process may be adjusted within a range where the pads are substantially melted and the connecting posts are not melted. In some other embodiments, the hardness of the connecting posts is higher than the hardness of the pads so that the connecting posts can be embedded into the pads.

In addition, since the metal lines (the first metal line 102a and the second metal line 102b) disposed on the first substrate 100 will also be heated during the heating process, the melting temperature of the metal lines is higher than the melting temperature of the pads (the first pad 104a and the second pad 104b) in accordance with some embodiments. Specifically, the ratio of the melting temperature of the metal lines to the melting temperature of the pads is in a range from about 1.5 to about 35, or from about 1.5 to about 17 in accordance with some embodiments. It should be noted that the ratio of the melting temperature of the metal lines to the melting temperature of the pads should not be too small, or the metal lines may also be melted or deformed during the heating process and may cause the risk of broken metal lines. The ratio of the melting temperature of the metal lines to the melting temperature of the pads should not be too great, or the difference between the coefficient of expansion of the metal lines and the coefficient of expansion of the pads may be too great so that the metal lines and the pads may be peeled off.

As described above, the pads (the first pad 104a and the second pad 104b) may be formed of a conductive material having a relatively low melting temperature compared to the material of the metal lines 102a/102b. The conductive material having a relatively low melting temperature for forming the pad may include, but is not limited to, solder materials, tin, indium, gallium, tin alloys, indium alloys, gallium alloys, or gallium-indium alloys. The connecting posts (the first connecting post 210a and the second connecting post 210b) may be formed of a conductive material having a relatively high melting temperature compared to the material of the pads. The conductive material having a relatively high melting temperature for forming the connecting posts may include, but is not limited to, copper, aluminum, tungsten, titanium, gold, silver, molybdenum, copper alloys, aluminum alloys, tungsten alloys, titanium alloys, gold alloys, silver alloys, or molybdenum alloys. In addition, the metal lines may also be formed of a conductive material having a relatively high melting temperature compared to the material of the pads. The conductive material having a relatively high melting temperature for forming the metal lines may include, but is not limited to, copper, aluminum, tungsten, titanium, gold, silver, molybdenum, copper alloys, aluminum alloys, tungsten alloys, titanium alloys, gold alloys, silver alloys, or molybdenum alloys.

The melting temperatures of the materials described above are listed below.

| Materials | Melting temperature(° C.) |
| --- | --- |
| solder | 400 |
| Sn | 232.06 |
| In | 156.76 |
| In—Ga alloy | 100 |
| Ga | 29.76 |
| Mo | 2623 |
| Au | 1,064.58 |
| Cu | 1,084.6 |
| Ti | 1,660 |
| W | 3,407 |
| Ag | 961 |
| Al | 660.25 |

Figure 3:
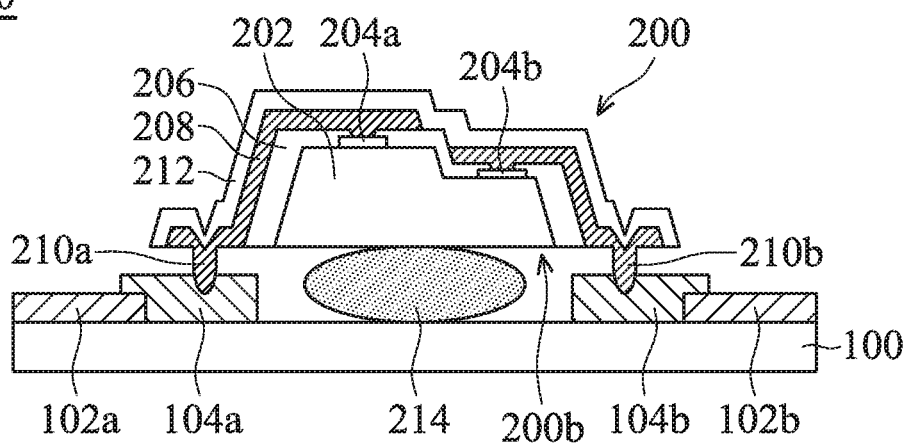
FIGS. 3-7 illustrate the cross-sectional views of the display device in accordance with some embodiments of the present disclosure.

Next, referring to FIG. 3, FIG. 3 illustrates a cross-sectional view of the display device 20 in accordance with some embodiments of the present disclosure. It should be noted that the same or similar elements or layers in above and below contexts are represented by the same or similar reference numerals. The materials, manufacturing methods and functions of these elements or layers are the same or similar to those described above, and thus will not be repeated herein. The difference between the display device 20 in FIG. 3 and the display device 10 in FIG. 1 is that the first connecting post 210a and the second connecting post 210b have a different profile. As shown in FIG. 3, the display device 20 may have the bell-shaped first connecting post 210a and bell-shaped second connecting post 210b. In these embodiments, the first connecting post 210a and the second connecting post 210b include a blunt end. In one embodiment, the second connecting portions 210a/210b having blunt ends can further reduce the accumulation of static-electricity than the connecting portions 210a/210b having sharp ends, and can increase the efficiency of electrical connection between the connecting portions 210a/210b and pads 104a/104b. This is because that the connecting portions 210a/210b having sharp ends may generate a corona discharge to damage the pads 104a/104b, and the surfaces of the pads 104a/104b may be oxidized. In such cases, the efficiency of the electrical connection between the connecting portions 210a/210b and the pads 104a/104b may be reduced. In fact, the connecting posts 201a/201b may have any other suitable shapes as long as the connecting posts protrude from the bottom side 200b of the electronic device 200 and can be embedded in the pads. For example, the first connecting post 210a and the second connecting post 210b may have tapered shapes, triangular shapes, rectangular shapes, but they are not limited thereto.

Figure 4:
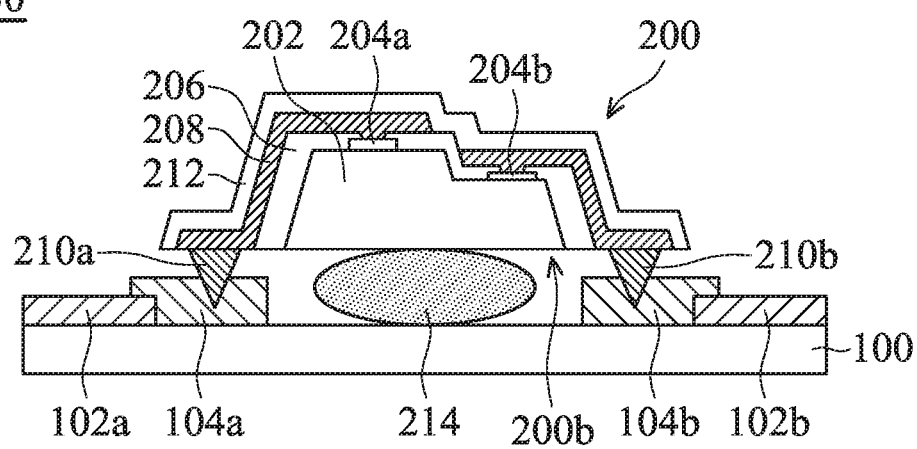

Next, referring to FIG. 4, FIG. 4 illustrates a cross-sectional view of the display device 30 in accordance with some embodiments of the present disclosure. The difference between the display device 30 in FIG. 4 and the display device 10 in FIG. 1 is that the materials of the first connecting post 210a and the second connecting post 210b are different than that of the conductive layer 208 in the embodiment shown in FIG. 4. The connecting posts 210a/210b and the conductive layer 208 may be formed separately in accordance with some embodiments. As described above, the connecting posts (the first connecting post 210a and the second connecting post 210b) may be formed of a conductive material having a relatively high melting temperature compared to the material of the pads 104a/104b. In addition, the connecting posts 210a/210b may be formed of a conductive material having a relatively low melting temperature compared to the material of the conductive layer 208 so that the conductive layer 208 may be unaffected by the high temperature during the heating process. Accordingly, the functions such as the conductivity of the conductive layer 208 may be unaffected and the performance of the electronic device may be maintained.

Figure 5:
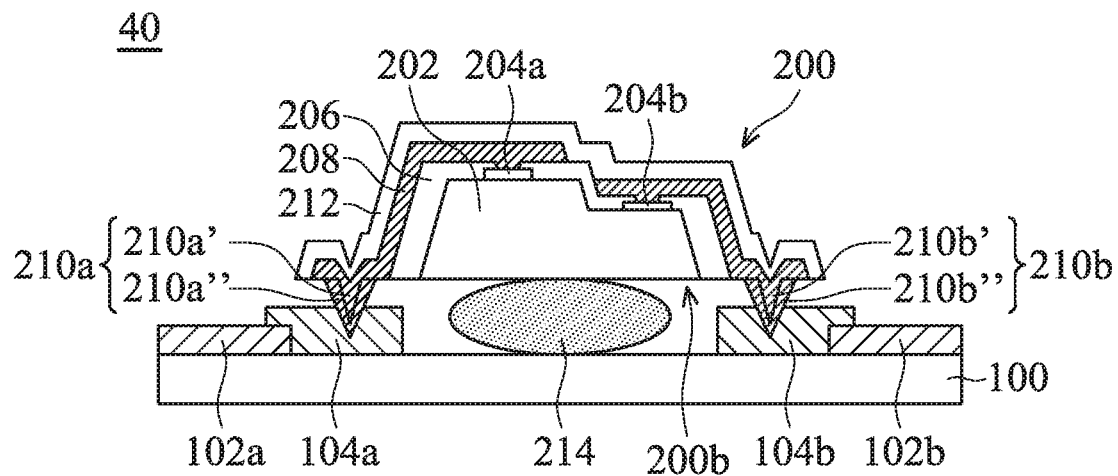

Next, referring to FIG. 5, FIG. 5 illustrates a cross-sectional view of the display device 40 in accordance with some embodiments of the present disclosure. The difference between the display device 40 in FIG. 5 and the display device 30 in FIG. 4 is that the first connecting post 210a and the second connecting post 210b include multilayer structures in the embodiment shown in FIG. 5. As shown in FIG. 5, the first connecting post 210a includes a first layer 210a' and a second layer 210a", and the second connecting post 210b includes a first layer 210b' and a second layer 210b". Specifically, the first layer 210a' of the first connecting post 210a and the first layer 210b' of the second connecting post 210b may be formed of the same material as that of the conductive layer 208 in accordance with some embodiments. In other words, the first layer 210a' and the first layer 210b' may be formed of a conductive material having a relatively high melting temperature. In some embodiments, the second layer 210a" of the first connecting post 210a and the second layer 210b" of the second connecting post 210b may be formed of a conductive material having a relatively low melting temperature compared to the material of the first layer 210a' and the first layer 210b' respectively. In addition, the second layer 210a" and the second layer 210b" is formed of a conductive material having a relatively high melting temperature compared to the material of the pads 104a/104b.

Figure 6:
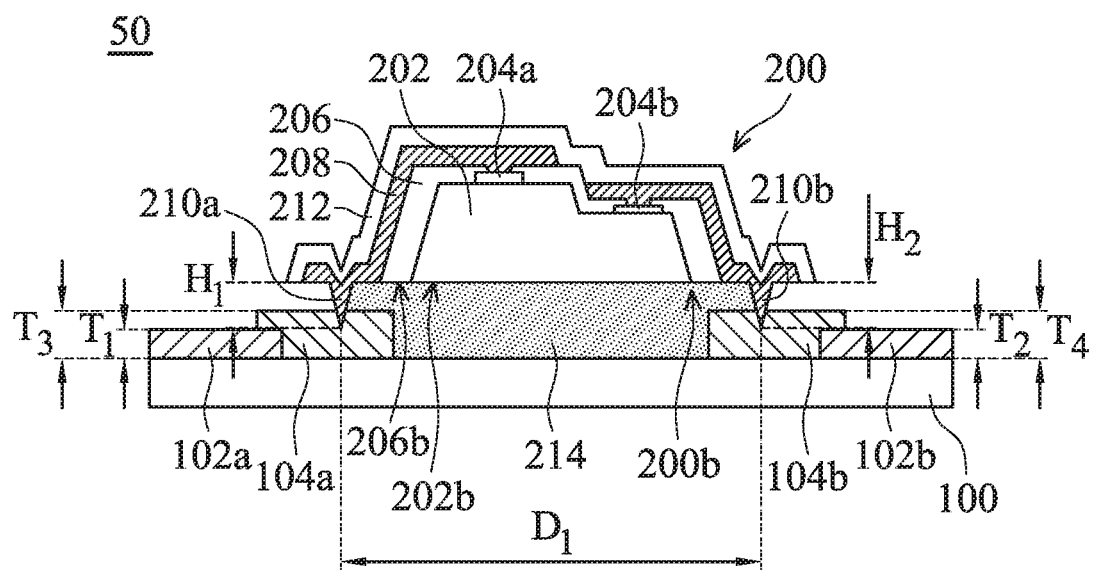

Next, referring to FIG. 6, FIG. 6 illustrates a cross-sectional view of the display device 50 in accordance with some embodiments of the present disclosure. The difference between the display device 50 in FIG. 6 and the display device 10 in FIG. 1 is that the adhesive layer 214 is filled in the space between the electronic device 200 and the first substrate 100 in the embodiment shown in FIG. 6. Specifically, the adhesive layer 214 is substantially filled in the space defined by the semiconductor die 202, the first dielectric layer 206, the connecting posts 210a/210b, the pads 104a/104b and the first substrate 100. In this embodiment, the adhesive layer 214 is in physical contact with the first pad 104a and the second pad 104b. In some embodiments, the adhesive layer 214 is also in physical contact with the first connecting post 210a and the second connecting post 210b.

Figure 7:
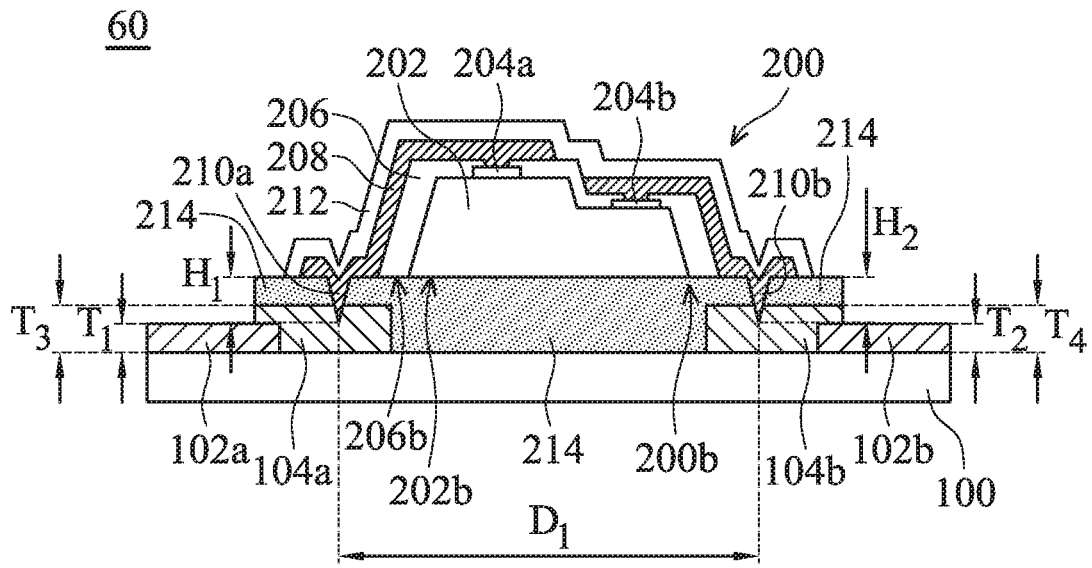

Next, referring to FIG. 7, FIG. 7 illustrates a cross-sectional view of the display device 60 in accordance with some embodiments of the present disclosure. The difference between the display device 60 in FIG. 7 and the display device 50 in FIG. 6 is that the adhesive layer 214 further extends over the pads 104a/104b located outside the connecting posts 210a/210b in the embodiment shown in FIG. 7. As shown in FIG. 7, the adhesive layer 214 substantially covers the entire first pad 104a and the second pad 104b. In some embodiments, the edge of the adhesive layer 214 may be substantially aligned with the edge of the pads 104a/104b.

Figure 8A:
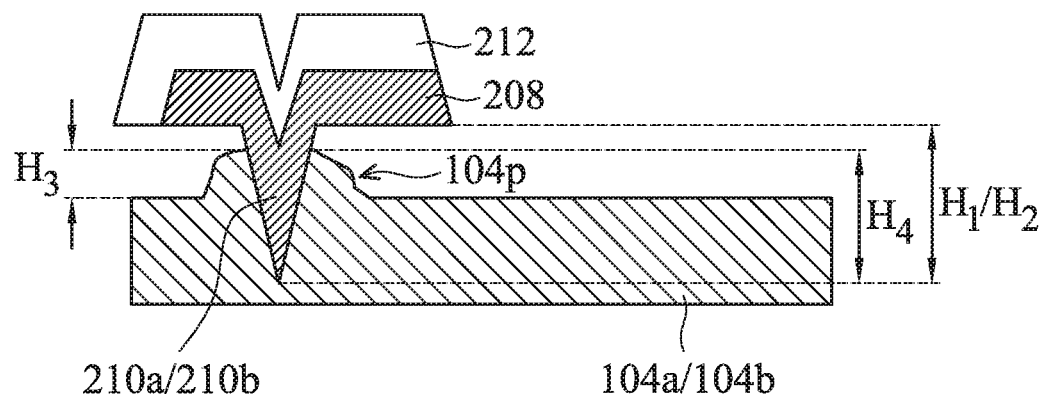
FIGS. 8A-8E illustrate the cross-sectional views of the region M in FIG. 1 in accordance with some embodiments.
Figure 8B:
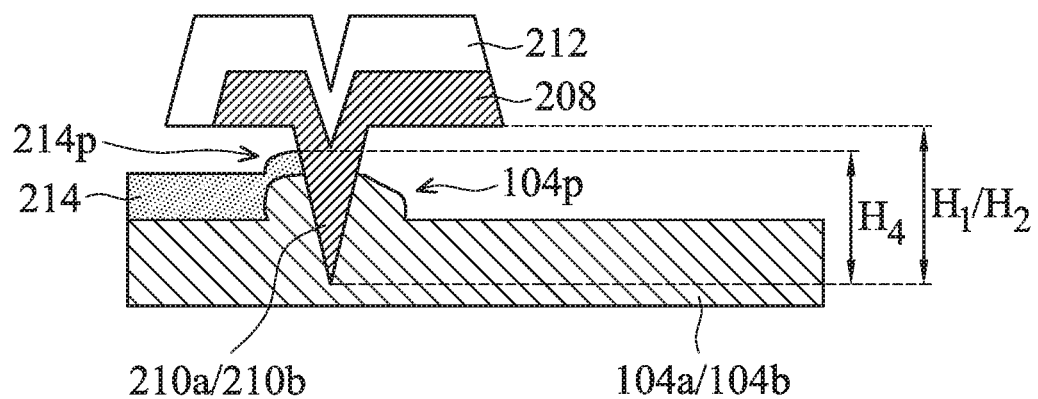
Figure 8C:
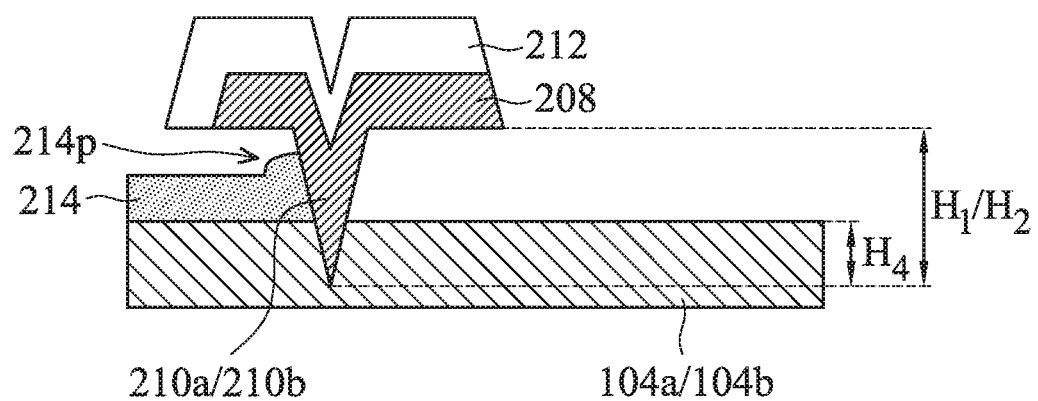
Figure 8D:
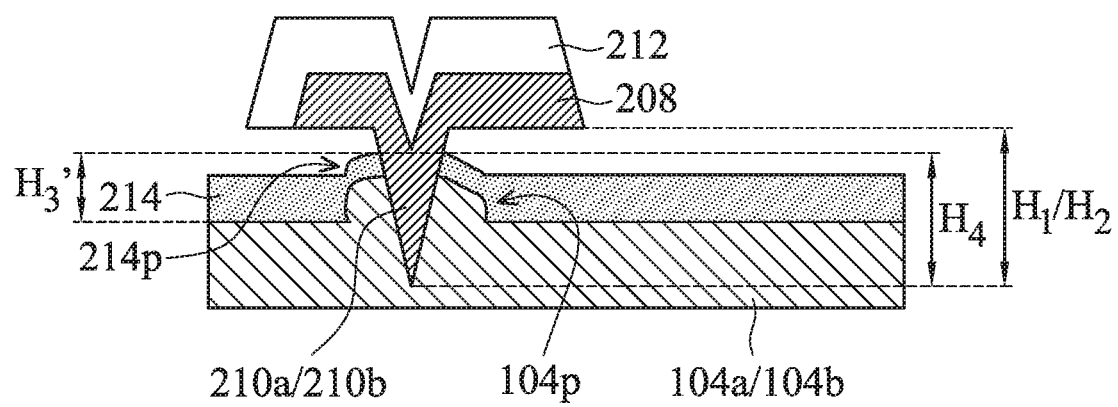
Figure 8E:
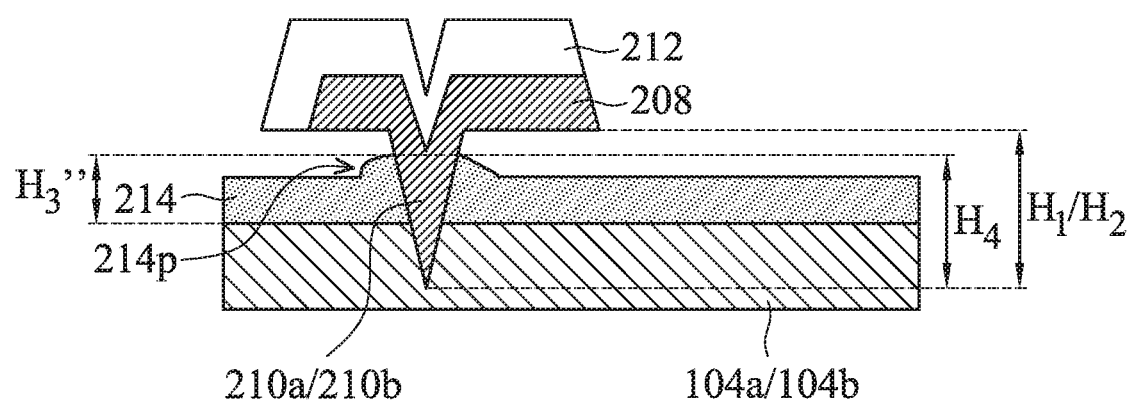

Next, referring to FIGS. 8A-8E, FIGS. 8A-8E illustrate the cross-sectional views of the region M in FIG. 1 in accordance with some embodiments. It should be understood that some of the elements are omitted for clarity. As described above, at least a portion of the connecting posts (the first connecting post 210a and the second connecting post 210b) are embedded in the pads (the first pad 104a and the second pad 104b). Therefore, a portion of the pad will be extruded and a bulging portion is formed around the position where the connecting post embeds the pad. As shown in FIG. 8A, the pad (the first pad 104a or the second pad 104b) includes a bulging portion 104p around the portion of the connecting post (the first connecting post 210a or the second connecting post 210b) that is embedded in the pad in accordance with some embodiments. As shown in FIG. 8B, in some embodiments where the adhesive layer 214 is filled in the space between the electronic device 200 and the first substrate 100 (as shown in FIG. 6), the pad includes a bulging portion 104p, and the adhesive layer 214 also includes a swelling portion 214p around the portion of the connecting post that is embedded in the pad. As shown in FIG. 8C, in some embodiments where the adhesive layer 214 is filled in the space between the electronic device 200 and the first substrate 100 (as shown in FIG. 6), the adhesive layer 214 includes a swelling portion 214p around the connecting post while the pad does not extrude. In addition, as shown in FIG. 8D, in some other embodiments where the adhesive layer 214 substantially covers the entire pad (as shown in FIG. 7), the pad includes a bulging portion 104p, and the adhesive layer 214 also includes a swelling portion 214p around the portion of the connecting post that is embedded in the pad. As shown in FIG. 8E, in some other embodiments where the adhesive layer 214 substantially covers the entire pad (as shown in FIG. 7), the adhesive layer 214 includes a swelling portion 214p around the connecting post while the pad is not extruded.

In some embodiments, the bulging portion 104p of the pad has a height $H_3$ (as shown in FIG. 8A). The height $H_3$ may be defined as the distance between the highest point of the bulging portion 104p and the lowest point of the bulging portion 104p in the X direction of first substrate 100. In some embodiments, the height $H_3$ of the bulging portion 104p may be in a range from about 0.1 μm to about 5 μm, or from about 1 um to about 3 um. In some embodiments where the pad and the adhesive layer 214 include the bulging portion 104p and the swelling portion 214p respectively, the bulging portion 104p and the swelling portion 214p have a total height $H_3'$ (as shown in FIG. 8D). The total height $H_3'$ may be defined as the distance between the highest point of the swelling portion 214p and the lowest point of the bulging portion 104p in the X direction of first substrate 100. In some embodiments, the height $H_3'$ of the bulging portion 104p and the swelling portion 214p may be in a range from about 0.1 μm to about 5 μm, or from about 1 um to about 3 um. Moreover, in some embodiments where the adhesive layer 214 includes the swelling portion 214p, the swelling portion 214p of the adhesive layer 214 has a height $H_3''$ (as shown in FIG. 8E). The height $H_3''$ may be defined as the distance between the highest point of the swelling portion 214p and the lowest point of the swelling portion 214p in the X direction of first substrate 100. In some embodiments, the height $H_3''$ of the swelling portion 214p may be in a range from about 0.1 μm to about 5 μm, or from about 1 um to about 3 um.

In some embodiments, the portion of the connecting post 210a/210b that is embedded in the pad 104a/104b has a height $H_4$ (as shown in FIG. 8A). In some embodiments, the portion of the connecting post 210a/210b that is embedded in the pad 104a/104b and the adhesive layer 214 has a height $H_4$ (as shown in FIG. 8D). In some embodiments, the portion of the connecting post 210a/210b that is embedded in the adhesive layer 214 has a height $H_4$ (as shown in FIG. 8E). As described above, the first connecting post 210a and the second connecting post 210b may respectively have a height $H_1$ and a height $H_2$ in the X direction of the first substrate 100. In some embodiments, the ratio of the height $H_4$ of the portion of the connecting post 210a/210b that is embedded in the pad 104a/104b and/or the adhesive layer 214 to the height $H_1$ of the first connecting post 210a is in a range from 0.1 to 1 (i.e. $0.1 \leq H_4/H_1 \leq 1$). In some embodiments, the ratio of the height $H_4$ of the portion of the connecting post 210a/210b that is embedded in the pad 104a/104b and/or the adhesive layer 214 to the height $H_2$ of the second connecting post 210b is in a range from 0.1 to 1 (i.e. $0.1 \leq H_4/H_2 \leq 1$).

Figure 9:
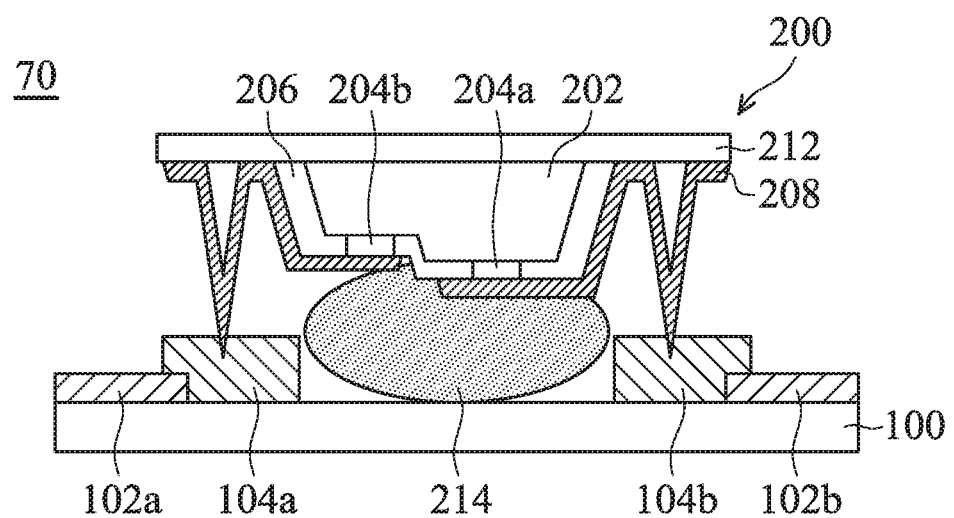
FIG. 9 illustrate a cross-sectional view of the display device in accordance with some embodiments of the present disclosure.

Next, referring to FIG. 9, FIG. 9 illustrates a cross-sectional view of the display device 70 in accordance with some embodiments of the present disclosure. The difference between the display device 70 in FIG. 9 and the display device 10 in FIG. 1 is that the electronic device 200 is arranged in flip chip type in the embodiment shown in FIG. 9. In this embodiment, the conductive layer 208 may directly serve as the connecting posts to embed in the pads 104a/104b. The electronic device 200 may be electrically connected to the pads 104a/104b by the portion of the conductive layer 208 that is embedded in the pad.

Figure 10:
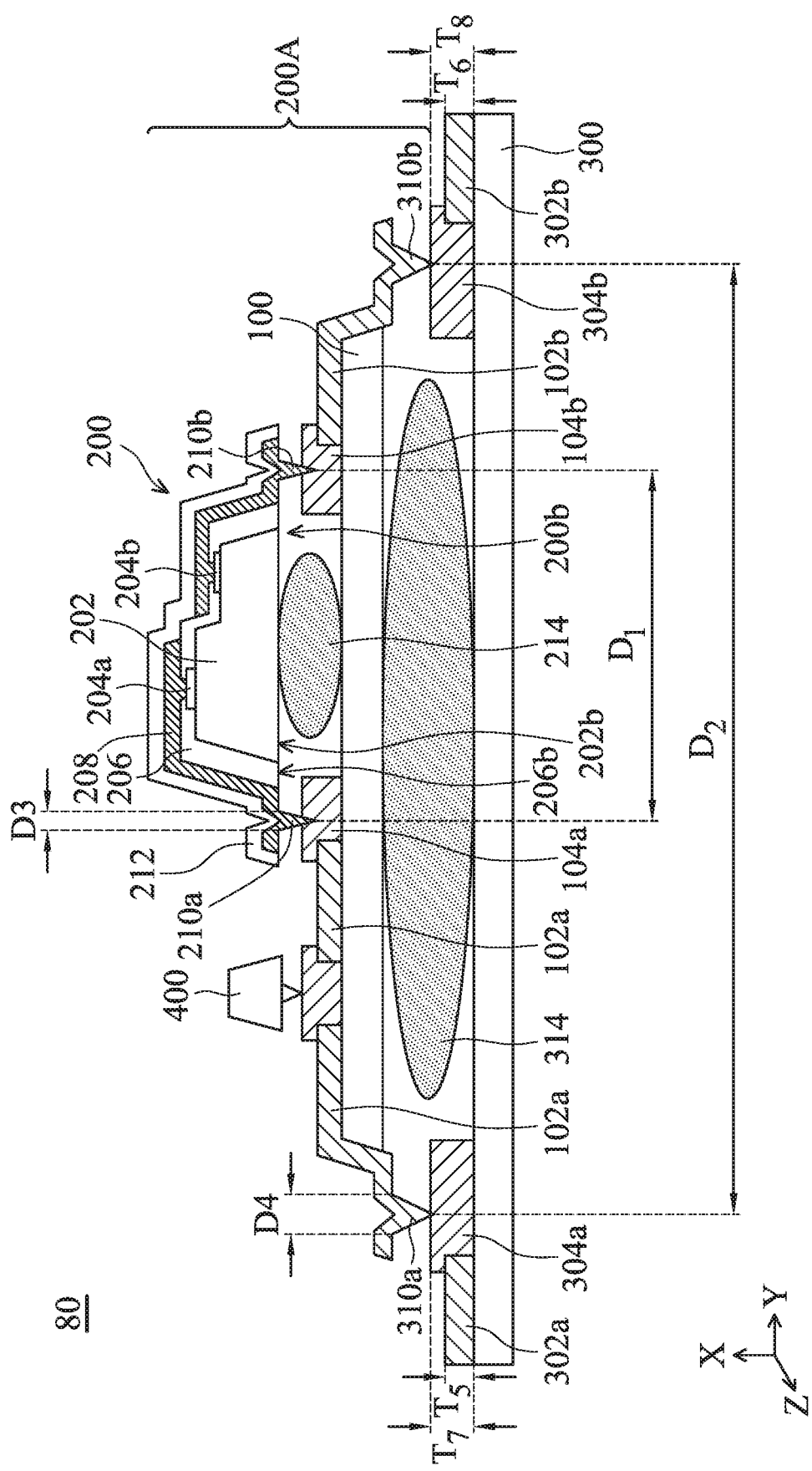
FIG. 10 illustrates a cross-sectional view of the display device in accordance with some embodiments of the present disclosure.

Next, referring to FIG. 10, FIG. 10 illustrates a cross-sectional view of the display device 80 in accordance with some embodiments of the present disclosure. The display device 80 includes an integrated electronic component 200A and a second substrate 300 disposed below the integrated electronic component 200A. The integrated electronic component 200A is substantially the same as the display device 10 described in FIG. 1. Specifically, the integrated electronic component 200A includes the first substrate 100, the first metal line 102a and the second metal line 102b disposed on the first substrate 100, and the first pad 104a and the second pad 104b disposed on the first substrate 100. The first pad 104a and the second pad 104b are electrically connected to the first metal line 102a and the second metal line 102b respectively. The integrated electronic component 200A also includes the electronic device 200 disposed on the first pad 104a and the second pad 104b. The electronic device 200 includes the first connecting post 210a and the second connecting post 210b, and a portion of the first connecting post 210a is embedded in the first pad 104a and a portion of the second connecting post 210b is embedded in the second pad 104b. The materials, manufacturing methods and functions of these elements are the same or similar to those described above, and thus are not repeated herein.

In some embodiments, the second substrate 300 may serve as a destination substrate (such as an array substrate) of the display device 80. The first substrate 100 serves as an intermediate substrate to carry the elements formed thereon to the destination substrate (e.g., the second substrate 300). In some embodiments, a plurality of electronic devices 200 are disposed on the first substrate 100. As described above, the electronic device 200 may include, but is not limited to, a digital circuit, an LED, a photodiode, a transistor, or any other suitable electronic devices. The electronic device 200 may be a micro LED in accordance with some embodiments. In some embodiments, the electronic device 200 further includes at least one integrated circuit 400 disposed on the first substrate 100. In some other embodiments, the electronic device 200 includes a circuit having multiple integrated circuits, other electronic elements or other optoelectronic elements and conductive wires interconnecting the multiple electronic elements to form a circuit on the first substrate 100. The first substrate 100 may carry the integrated electronic component 200A where multiple elements are formed and disposed on the second substrate 300, and thus may reduce the times that are required for the transfer.

In some embodiments, the material of the second substrate 300 may include, but is not limited to, glass, quartz, sapphire, polycarbonate (PC), polyimide (PI), polyethylene terephthalate (PET), rubbers, glass fibers, other polymer materials, any other suitable substrate material, or a combination thereof. In some embodiments, the second substrate 300 may be formed of a metal-glass fiber composite plate, a metal-ceramic composite plate, a printed circuit board, or any other suitable material, but it is not limited thereto. The material of the second substrate 300 may be the same as or different than the material of the first substrate 100.

In addition, the display device 80 also includes a third metal line 302a and a fourth metal line 302b disposed on the second substrate 300. The third metal line 302a and the fourth metal line 302b may be any conductive element on the second substrate 300. For example, the third metal line 302a and the fourth metal line 302b each may be the conductive elements of the circuit on the array substrate. In some embodiments, the third metal line 302a and the fourth metal line 302b may be the data line or scan line on the array substrate. The third metal line 302a and the fourth metal line 302b may respectively have a thickness $T_5$ and a thickness $T_6$ in the X direction of the first substrate 100. In some embodiments, the thickness $T_5$ of the third metal line 302a may be in a range from about 0.1 um to about 1 um, or from about 0.2 um to about 0.6 um. In some embodiments, the thickness $T_6$ of the fourth metal line 302b may be in a range from about 0.1 um to about 1 um, or from about 0.2 um to about 0.6 um. The thickness $T_5$ of the third metal line 302a may be the same with or different from the thickness $T_6$ of the fourth metal line 302b.

In some embodiments, the third metal line 302a and the fourth metal line 302b each may be formed of conductive materials. The conductive material for forming the third metal line 302a and the fourth metal line 302b may include, but is not limited to, copper, aluminum, tungsten, titanium, gold, silver, molybdenum, copper alloys, aluminum alloys, tungsten alloys, titanium alloys, gold alloys, silver alloys, molybdenum alloys, any other suitable conductive materials, or a combination thereof. In some embodiments, the third metal line 302a and the fourth metal line 302b each may be formed of a conductive material having a relatively high melting temperature. In some embodiments, the third metal line 302a and the fourth metal line 302b each may be formed of a conductive material having a melting temperature in a range from about 660° C. to about 3410° C. In addition, in some embodiments, the third metal line 302a and/or the fourth metal line 302b may include multilayer structures.

As shown in FIG. 10, the display device 80 also includes a third pad 304a and a fourth pad 304b disposed on the second substrate 300. The third pad 304a and the fourth pad 304b are electrically connected to the third metal line 302a and the fourth metal line 302b respectively. The third pad 304a provides the electrical connection between the integrated electronic component 200A and the third metal line 302a on the second substrate 300. The fourth metal line 302b provides the electrical connection between the integrated electronic component 200A and the fourth metal line 302b on the second substrate 300. As shown in FIG. 10, the third pad 304a and the fourth pad 304b at least partially overlaps the third metal line 302a and the fourth metal line 302b respectively, so that the electrical connection between the pads 304a/304b and the metal lines 302a/302b may be well maintained. In particular, the overlap between the pads and the metal lines may assist in the transmission of the electrical signals in the metal lines or reduce the possibility of leakage of electricity.

In some embodiments, the third pad 304a and the fourth pad 304b may respectively have a thickness $T_7$ and a thickness $T_8$ in the X direction of the first substrate 100. In some embodiments, the thickness $T_7$ of the third pad 304a may be in a range from about 0.2 um to about 50 um, or from about 5 um to about 15 um. In some embodiments, the thickness $T_8$ of the fourth pad 304b may be in a range from about 0.2 um to about 50 um, or from about 5 um to about 15 um. The thickness $T_7$ of the third pad 304a may be the same as or different than the thickness $T_8$ of the fourth pad 304b. In some embodiments, the thickness $T_7$ of the third pad 304a is greater than the thickness $T_5$ of the third metal line 302a. In some embodiments, the thickness $T_8$ of the fourth pad 304b is greater than the thickness $T_6$ of the fourth metal line 302b. Furthermore, since the third pad 304a needs to transfer more current compared to the first pad 104a, an area (or a size) of the third pad 304a is greater than an area (or a size) of the first pad 104a in accordance with some embodiments. Similarly, since the fourth pad 304b needs to transfer more current compared to the second pad 104b, an area (or a size) of the fourth pad 304b is greater than an area (or a size) of the second pad 104b in accordance with some embodiments.

In some embodiments, the third pad 304a and the fourth pad 304b each may be formed of conductive materials. The conductive material for forming the third pad 304a and the fourth pad 304b may include, but is not limited to, solder materials, tin, indium, gallium, tin alloys, indium alloys, gallium alloys, gallium-indium alloys or a combination thereof. In some embodiments, the third pad 304a and the fourth pad 304b each may be formed of conductive materials having a relatively low melting temperature. In particular, the third pad 304a and the fourth pad 304b each may be formed of a conductive material having a relatively low melting temperature compared to the melting temperature of the third metal line 302a and the fourth metal line 302b. In some embodiments, the third pad 304a and the fourth pad 304b each may be formed of conductive materials having a temperature in a range from about 100° C. to about 400° C.

On the other hand, it should be noted that the first metal line 102a of the integrated electronic component 200A further includes a third connecting post 310a and the second metal line 102b of the integrated electronic component 200A further includes a fourth connecting post 310b. The third connecting post 310a and the fourth connecting post 310b are electrically connected to the first metal line 102a and the second metal line 102b respectively. As shown in FIG. 10, the first metal line 102a and the second metal line 102b extend from the first substrate 100 toward the second substrate 300 to provide the electrical connection between the integrated electronic component 200A and the second substrate 300. The third connecting post 310a and the fourth connecting post 310b extend toward the first substrate 100. The third connecting post 310a and the fourth connecting post 310b extend toward the third pad 304a and the fourth pad 304b respectively. The third connecting post 310a and the fourth connecting post 310b are in contact with the third pad 304a and the fourth pad 304b respectively. In some embodiments, at least a portion of the third connecting post 310a is embedded in the third pad 304a and at least a portion of the fourth connecting post 310b is embedded in the fourth pad 304b. Thus, the third connecting post 310a is electrically connected to the third pad 304a and the fourth connecting post 310b is electrically connected to the fourth pad 104d.

In some embodiments, the connecting posts (the third connecting post 310a and the fourth connecting post 310b) and the metal lines (the first metal line 102a and the second metal line 102b) are integrally formed. The connecting posts and the metal lines may be a continuous structure. In some other embodiments, the connecting posts and the metal lines are separately formed. The connecting posts and the metal lines may be independent elements. In addition, the connecting posts (the third connecting post 310a and the fourth connecting post 310b) and the metal lines (the first metal line 102a and the second metal line 102b) may be formed of the same or different materials. The third connecting post 310a and the fourth connecting post 310b may be formed of the same or different materials.

In some embodiments, the third connecting post 310a and the fourth connecting post 310b each may be formed of conductive materials. The conductive material for forming the third connecting post 310a and the fourth connecting post 310b may include, but is not limited to, copper, aluminum, tungsten, titanium, gold, silver, molybdenum, copper alloys, aluminum alloys, tungsten alloys, titanium alloys, gold alloys, silver alloys, molybdenum alloys, any other suitable conductive materials, or a combination thereof. In some embodiments, the third connecting post 310a and the fourth connecting post 310b each may be formed of a conductive material having a relatively high melting temperature. In some embodiments, the third connecting post 310a and the fourth connecting post 310b each may be formed of a conductive material having a melting temperature in a range from about 660° C. to about 3410° C. In some embodiments, the third connecting post 310a and the fourth connecting post 310b each may be formed of a conductive material having a relatively high melting temperature compared to the material of the third pad 304a and the fourth pad 304b. In some embodiments, the first metal line 102a and the second metal line 102b each may be formed of a conductive material having a relatively high melting temperature compared to the material of the third pad 304a and the fourth pad 304b.

Furthermore, as described above, the first connecting post 210a and the second connecting post 210b are separated apart from each other by a distance $D_1$. In some embodiments, the distance $D_1$ between the first connecting post 210a and the second connecting post 210b is in a range from about 1 um to about 200 um, or from about 2 um to about 50 um. As shown in FIG. 10, the third connecting post 310a and the fourth connecting post 310b are separated apart from each other by a distance $D_2$. In some embodiments, the distance $D_2$ between the third connecting post 310a and the fourth connecting post 310b is in a range from about 3 um to about 600 um, or from about 6 um to about 150 um. In some embodiments, the distance $D_2$ between the third connecting post 310a and the fourth connecting post 310b is greater than the distance $D_1$ between the first connecting post 210a and the second connecting post 210b. Moreover, in some embodiments, the width D4 in Y direction of the third connecting post 310a may be greater than the width D3 in Y direction of the first connecting post 210a. In some embodiments, the size of the fourth connecting post 310b may be greater than the size of the second connecting post 210b.

In addition, the melting temperature of the connecting posts (the third connecting post 310a and the fourth connecting post 310b) is higher than the melting temperature of the pads (the third pad 304a and the fourth pad 304b) in accordance with some embodiments. In some embodiments, the melting temperature of the metal lines (the first metal line 102a, the second metal line 102b, the third metal line 302a and the fourth metal line 302b) is higher than the melting temperature of the pads (the first pad 104a and the second pad 104b). Specifically, the ratio of the melting temperature of the metal lines to the melting temperature of the pads is in a range from about 1.5 to about 35, or from about 1.5 to about 17 in accordance with some embodiments. It should be noted that the ratio of the melting temperature of the metal lines to the melting temperature of the pads should not be too small, or the metal lines may also be melted or deformed during the heating process and may cause the risk of broken metal lines. The ratio of the melting temperature of the metal lines to the melting temperature of the pads should not be too great, or the difference between the coefficient of expansion of the metal lines and the coefficient of expansion of the pads may be too great so that the metal lines and the pads may be peeled off.

As described above, the pads (the third pad 304a and the fourth pad 304b) may be formed of a conductive material having a relatively low melting temperature compared to the material of the metal lines. The conductive material having a relatively low melting temperature for forming the pad may include, but is not limited to, solder materials, tin, indium, gallium, tin alloys, indium alloys, gallium alloys, or gallium-indium alloys. The connecting posts (the third connecting post 310a and the fourth connecting post 310b) may be formed of a conductive material having a relatively high melting temperature compared to the material of the pads. The conductive material having a relatively high melting temperature for forming the connecting posts may include, but is not limited to, copper, aluminum, tungsten, titanium, gold, silver, molybdenum, copper alloys, aluminum alloys, tungsten alloys, titanium alloys, gold alloys, silver alloys, or molybdenum alloys. In addition, the metal lines (the third metal line 302a and the fourth metal line 302b) may also be formed of a conductive material having a relatively high melting temperature compared to the material of the pads. The conductive material having a relatively high melting temperature for forming the metal lines may include, but is not limited to, copper, aluminum, tungsten, titanium, gold, silver, molybdenum, copper alloys, aluminum alloys, tungsten alloys, titanium alloys, gold alloys, silver alloys, or molybdenum alloys.

The display device 80 also includes an adhesive layer 314 disposed between the first substrate 100 and the second substrate 300. The adhesive layer 314 adhere the first substrate 100 and the second substrate 300 together and the third connecting post 310a and the fourth connecting post 310b are held in physical contact with the third pad 304a and the fourth pad 304b on the second substrate 300 respectively. The adhesive layer 314 may be formed of adhesive materials. In some embodiments, the adhesive layer 314 may be an insulator. In some embodiments, the material of the adhesive layer 314 may include, but is not limited to, heat-curing adhesives, light-curing adhesives, or a combination thereof. The light-curing adhesives may include UV light-curing adhesives or visible light-curing adhesives. The material of the adhesive layer 314 may be the same as or different than the material of the adhesive layer 214.

Figure 11A:
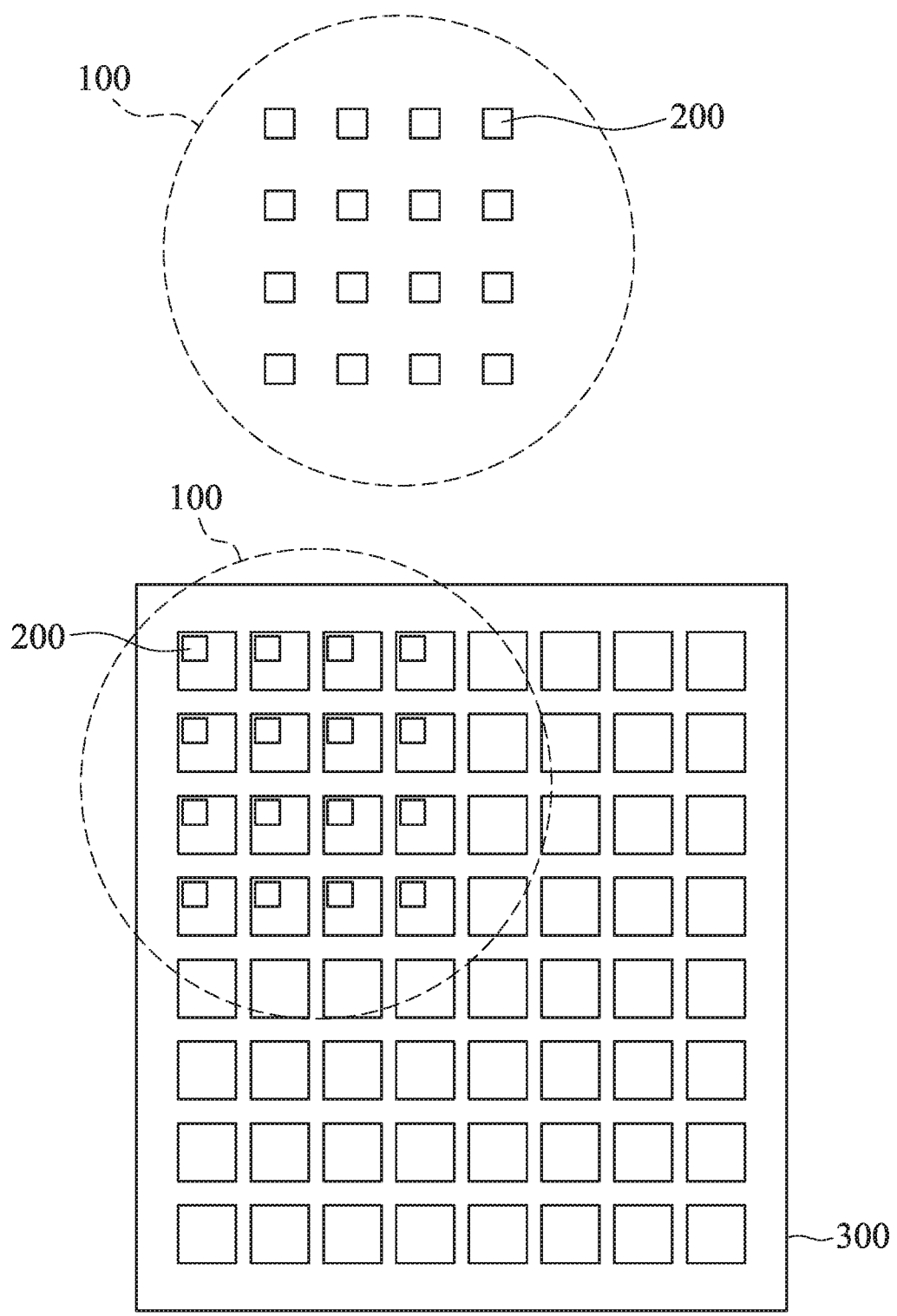
FIGS. 11A-11C illustrate the diagrams showing the transfer process of the electronic devices to the destination substrate in accordance with some embodiments of the present disclosure.
Figure 11B:
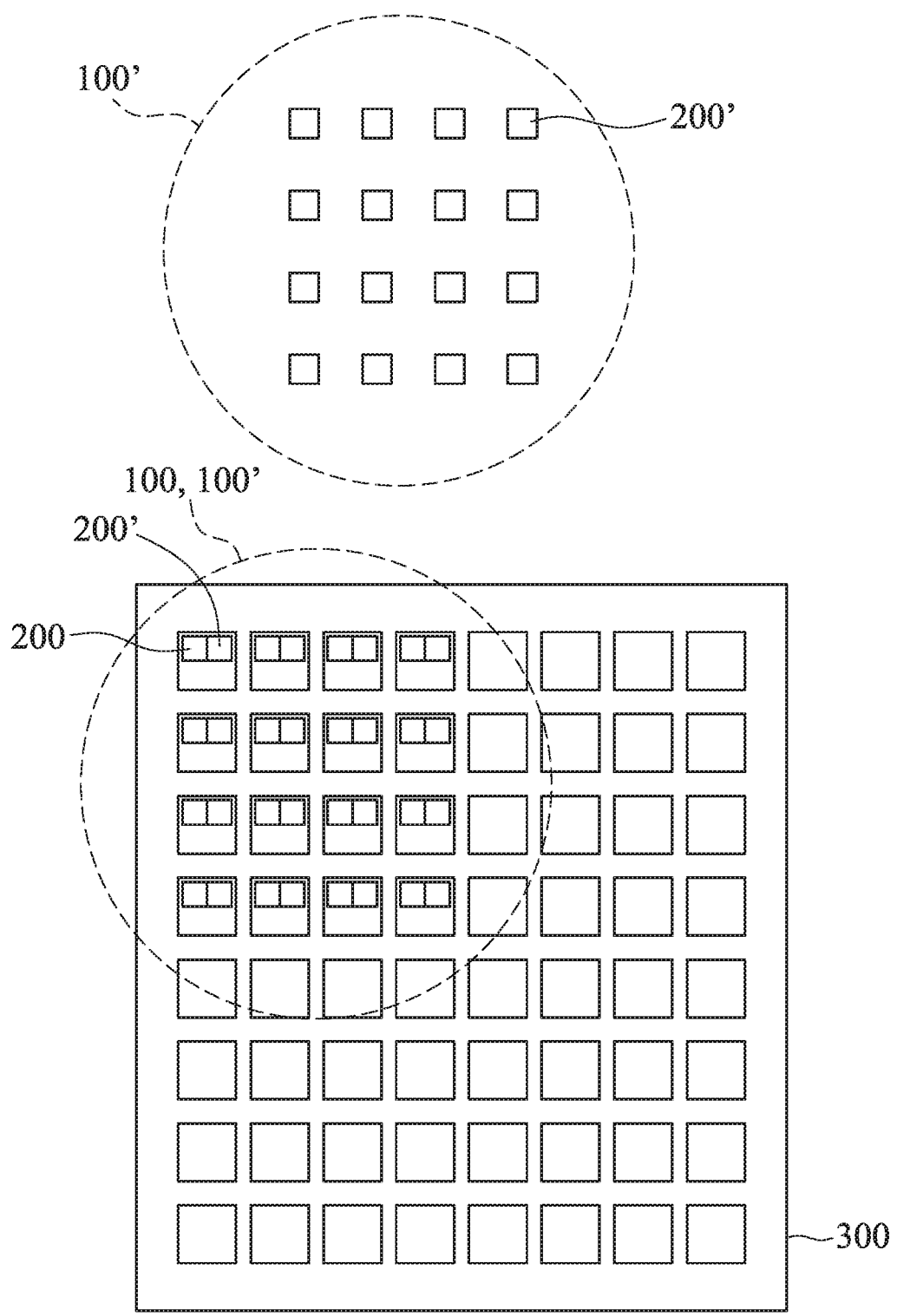
Figure 11C:
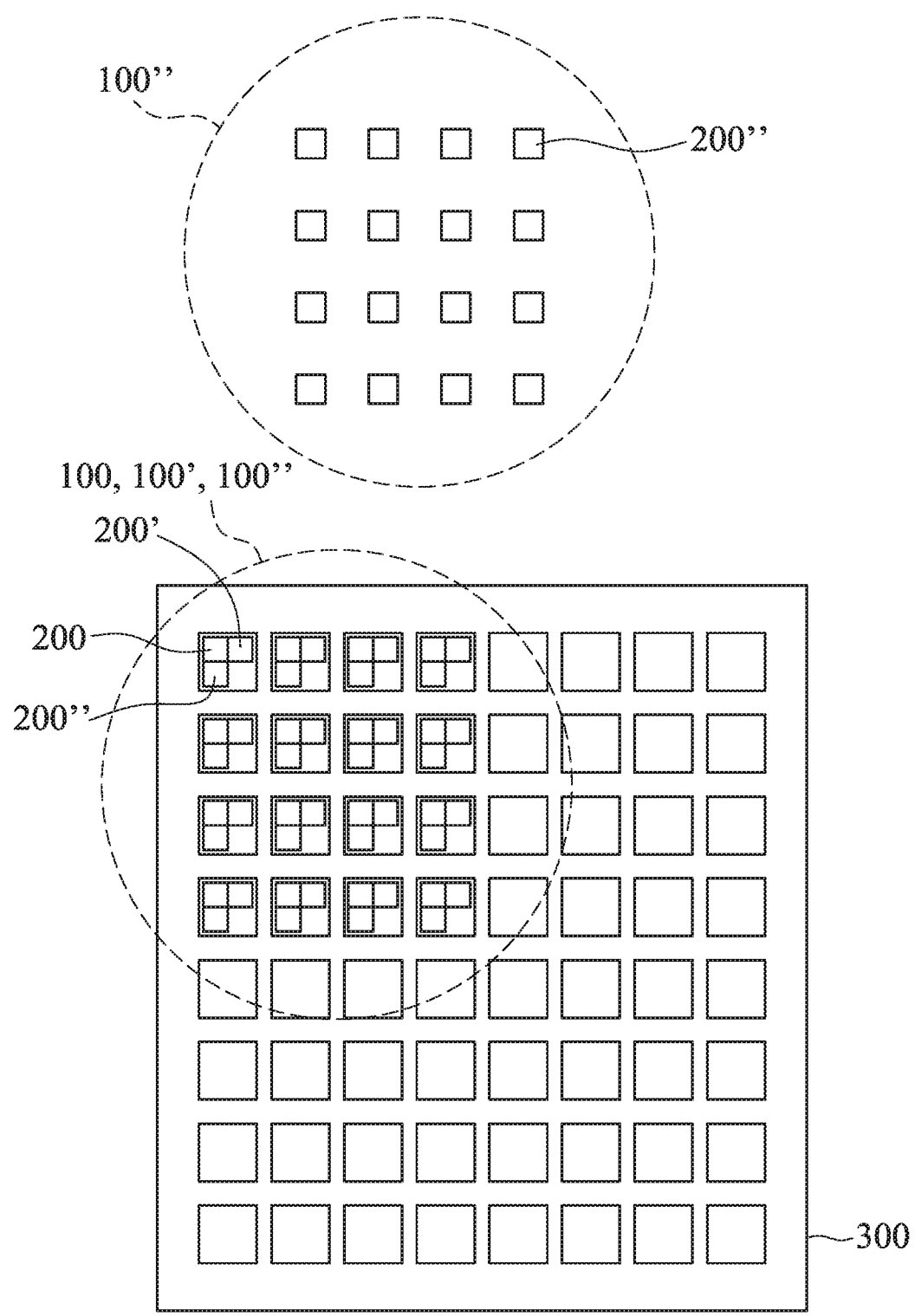

Next, referring to FIGS. 11A-11C, FIGS. 11A-11C illustrate the diagrams showing the transfer process of the electronic devices to the destination substrate in accordance with some embodiments of the present disclosure. As shown in FIG. 11A, the first substrate 100 may include multiple electronic devices 200 formed thereon. It should be understood that although only the electronic devices 200 are illustrated in FIG. 11A, the first substrate 100 may actually include various elements formed thereon (as shown in the FIG. 10). In this embodiment, the first substrate 100 serves as an intermediate substrate to gather the various elements such as the electronic devices 200 first and then transfer these elements to the second substrate 300 (e.g. a destination substrate). In some embodiments, the electronic devices 200 may be the micro LEDs emitting red light, green light, blue light, or a combination thereof.

In some other embodiments, more than one intermediate substrate may be transferred to the second substrate 300 and the intermediate substrates may carry different electronic devices. For example, as shown in FIGS. 11A-11C, the first substrate 100, 100' and 100" may carry the different electronic devices 200, 200' and 200" respectively, and the electronic devices 200, 200' and 200" may be integrated on the second substrate 300 first. The second substrate 300 encompassing the integrated electronic component then may be transferred to another destination substrate. In some embodiments, the electronic devices 200, 200' and 200" may be the micro LEDs emitting red light, green light and blue light respectively. As described above, the small electronic devices may be integrated on the intermediate substrate first and then the intermediate substrate carrying the integrated small electronic devices can be transferred to a destination substrate (e.g. an array substrate of the display device). Therefore, compared with transferring the small electronic devices one by one, the times that are required for transfer the small electronic device by an intermediate substrate are greatly reduced.

To summarize the above, the present disclosure provides a structure for improving the efficiency of the electrical connection between relatively small electronic devices such as micro LEDs or integrated electronic components and a relatively large destination substrate such as an array substrate. The display device provided in the present disclosure includes the connecting posts that can be securely embedded in the conductive elements of the destination substrate, such as the pads for the interconnection. The electronic devices can therefore maintain effective electrical connection to the circuit system on the destination substrate. In addition, the configuration of the intermediate substrate in the display device may reduce the times that are required for the transfer of the small electronic devices to the destination substrate in accordance with some embodiments of the present disclosure.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
a substrate;
a first metal line and a second metal line disposed on the substrate;
a first pad and a second pad disposed on the substrate and electrically connected to the first metal line and the second metal line respectively; and
an electronic device disposed on the first pad and the second pad, and the electronic device comprising a first connecting post and a second connecting post;
wherein a portion of the first connecting post is embedded in the first pad and a portion of the second connecting post is embedded in the second pad, and a topmost height of the first pad from the substrate is higher than a topmost height of the first metal line from the substrate along a normal direction of the substrate;
wherein the first connecting post does not overlap the first metal line in the normal direction of the substrate, wherein the first pad overlaps only one edge of the first metal line in a cross-sectional view, and the second pad overlaps only one edge of the second metal line in the cross-sectional view.

2. The display device as claimed in claim 1, wherein a distance between the first connecting post and the second connecting post is in a range from 1 μm to 200 μm.

3. The display device as claimed in claim 1, wherein the first pad overlaps the first metal line along the normal direction of the substrate.

4. The display device as claimed in claim 1, wherein a material of the first pad comprises solder materials, tin, indium, gallium, tin alloys, indium alloys, gallium alloys, gallium-indium alloys or a combination thereof.

5. The display device as claimed in claim 1, wherein the first pad comprises a bulging portion around the portion of the first connecting post that is embedded in the first pad.

6. The display device as claimed in claim 5, wherein a thickness of the first pad at the bulging portion is greater than a thickness of the first pad out of the bulging portion.

7. The display device as claimed in claim 1, wherein the first connecting post partially penetrates the first pad, and the second connecting post partially penetrates the second pad.

8. The display device as claimed in claim 1, wherein a ratio of a height of the portion of the first connecting post that is embedded in the first pad to a height of the first connecting post is greater than or equal to 0.1 and less than or equal to 1.

9. The display device as claimed in claim 1, further comprising an adhesive layer disposed between the electronic device and the substrate.

10. The display device as claimed in claim 9, wherein the adhesive layer comprises a swelling portion near the portion of the first connecting post that is embedded in the first pad.

11. The display device as claimed in claim 9, wherein the adhesive layer covers at least a portion of the first pad.

12. The display device as claimed in claim 9, wherein the electronic device comprises a conductive layer, and the conductive layer directly contacts the adhesive layer.

13. The display device as claimed in claim 9, wherein the adhesive layer is an insulator.

14. The display device as claimed in claim 1, wherein the electronic device comprises a conductive layer, and the first connecting post and the conductive layer are integrally formed.

15. The display device as claimed in claim 1, wherein the first connecting post includes a first layer and a second layer.

16. The display device as claimed in claim 1, wherein a melting temperature of the first connecting post is higher than a melting temperature of the first pad.

17. The display device as claimed in claim 1, wherein the first connecting post does not directly contact the first metal line, and the second connecting post does not directly contact the second metal line.

18. The display device as claimed in claim 1, wherein the first pad and the second pad partially overlap the first metal line and the second metal line respectively along the normal direction of the substrate.

* * * * *